United States Patent
Fu et al.

(10) Patent No.: US 7,618,893 B2
(45) Date of Patent: Nov. 17, 2009

(54) METHODS OF FORMING A LAYER FOR BARRIER APPLICATIONS IN AN INTERCONNECT STRUCTURE

(75) Inventors: Xinyu Fu, Fremont, CA (US); Keyvan Kashefizadeh, Dublin, CA (US); Ashish Subhash Bodke, San Jose, CA (US); Winsor Lam, Daly City, CA (US); Yiochiro Tanaka, Santa Clara, CA (US); Wonwoo Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/041,804

(22) Filed: Mar. 4, 2008

(65) Prior Publication Data

US 2009/0227105 A1  Sep. 10, 2009

(51) Int. Cl.
*H01L 21/44* (2006.01)

(52) U.S. Cl. .................. 438/679; 438/513; 438/700; 257/E21.054; 257/E21.218; 257/E21.277; 257/E21.293; 257/E21.319

(58) Field of Classification Search ............... 438/679, 438/700, 637, 680, 683, 685, 687, 688, 663, 438/513, 931
See application file for complete search history.

(56) References Cited

U.S. PATENT DOCUMENTS

| | | |
|---|---|---|
| 6,207,487 B1 | 3/2001 | Kim et al. |
| 6,242,808 B1 | 6/2001 | Shimizu et al. |
| 6,251,242 B1 | 6/2001 | Fu et al. |
| 6,277,249 B1 | 8/2001 | Gopalraja et al. |
| 6,284,646 B1 | 9/2001 | Leern |
| 6,305,314 B1 | 10/2001 | Sneh et al. |
| 6,335,240 B1 | 1/2002 | Kim et al. |
| 6,344,419 B1 | 2/2002 | Forster et al. |
| 6,348,376 B2 | 2/2002 | Lim et al. |
| 6,358,829 B2 | 3/2002 | Yoon et al. |
| 6,372,598 B2 | 4/2002 | Kang et al. |
| 6,399,491 B2 | 6/2002 | Jeon et al. |
| 6,416,822 B1 | 7/2002 | Chiang et al. |
| 6,428,859 B1 | 8/2002 | Chiang et al. |
| 6,451,119 B2 | 9/2002 | Sneh et al. |
| 6,451,695 B2 | 9/2002 | Sneh |
| 6,458,701 B1 | 10/2002 | Marsella et al. |
| 6,464,779 B1 | 10/2002 | Powell et al. |
| 6,468,924 B2 | 10/2002 | Maejima |
| 6,475,910 B1 | 11/2002 | Sneh |
| 6,478,872 B1 | 11/2002 | Chae et al. |
| 6,482,262 B1 | 11/2002 | Elers et al. |

(Continued)

*Primary Examiner*—David Nhu
(74) *Attorney, Agent, or Firm*—Patterson & Sheridan, LLP

(57) ABSTRACT

Methods of forming a barrier layer are provided. In one embodiment, the method includes providing a substrate into a physical valor deposition (PVD) chamber, supplying at least two reactive gases and an inert gas into the PVD chamber, sputtering a source material from a target disposed in the processing chamber in the presence of a plasma formed from the gas mixture, and forming a metal containing dielectric layer on the substrate from the source material. In another embodiment, the method includes providing a substrate into a PVD chamber, supplying a reactive gas the PVD chamber, sputtering a source material from a target disposed in the PVD chamber in the presence of a plasma formed from the reactive gas, forming a metal containing dielectric layer on the substrate from the source material, and post treating the metal containing layer in presence of species generated from a remote plasma chamber.

12 Claims, 5 Drawing Sheets

U.S. PATENT DOCUMENTS

| | | |
|---|---|---|
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,585,823 B1 | 7/2003 | Van Wijck |
| 6,599,572 B2 | 7/2003 | Saanila et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,660,660 B2 | 12/2003 | Haukka et al. |
| 6,686,271 B2 | 2/2004 | Raaijmakers et al. |
| 6,951,804 B2 * | 10/2005 | Seutter et al. ............... 438/618 |
| 2002/0106846 A1 * | 8/2002 | Seutter et al. ............... 438/200 |
| 2003/0022487 A1 * | 1/2003 | Yoon et al. .................. 438/642 |
| 2003/0059538 A1 | 3/2003 | Chung et al. |
| 2007/0209931 A1 | 9/2007 | Miller |
| 2008/0253613 A1 * | 10/2008 | Jones et al. ................. 382/103 |
| 2008/0268154 A1 * | 10/2008 | Kher et al. ............. 427/255.34 |

* cited by examiner

METHODS OF FORMING A LAYER FOR BARRIER APPLICATIONS IN AN INTERCONNECT STRUCTURE

BACKGROUND OF THE INVENTION

1. Field of the Invention

The present invention generally relates to methods for forming a barrier layer on a substrate. More specifically, the present invention provides methods for forming a layer for barrier applications in a metal interconnection structure.

2. Description of the Related Art

Interconnect structures of integrated circuits and semiconductor devices are typically fabricated by forming a series of dielectric layers and conductive layers in order to create a three dimensional network of conductive layers separated by dielectric material. The interconnect structure may be fabricated using, for example, a damascene structure in which a dielectric layer such as a low k dielectric layer is formed atop one or more conductive plugs or sub-layers. In order to form an electrical connection to the conductive sub-layers, the dielectric is patterned and etched to define via openings therethrough. Formation of the openings within the dielectric layer exposes a portion of the conductive line. Therefore, reliable formation of these interconnect features is an important factor in ensuring the quality, performance and reliability of devices formed on individual substrates and in each die.

The market for integrated circuits and semiconductor devices continually requires faster circuitry and greater circuit density, e.g., including millions of components on a single chip. As a result, the dimensions of the integrated circuit components shrink, and the choice of materials used to fabricate such components becomes increasingly important. For example, low resistivity metal interconnects, such as copper and aluminum, that provide conductive paths between the components on the integrated circuits, now require low dielectric constant layers, e.g., having a dielectric constant $\leq 4$, between the metal interconnects to provide insulating inter-metal layers that reduce capacitive coupling between adjacent metal lines, thereby enabling reliable performance at the same line widths.

Interconnection structure fabrication may be achieved by a variety of techniques. A typical method for forming layers of interconnection structure includes physical vapor depositing a barrier layer over a feature, such as a trench or a via, followed by a physical vapor depositing a metal layer on the barrier layer to fill the feature. Finally, after the deposited material layers, including the metal and the dielectric layers, are formed on the substrate, a planarization or an etching process is performed to define a conductive interconnect feature with desired dimensions on the substrate.

Problems encountered during metal interconnection manufacturing processes include metal diffusion and metal layer peeling. Metal atoms from the metal layers may diffuse to the adjacent dielectric layers during subsequent deposition processes, thereby deteriorating the electrical property of the devices. Accordingly, a conformal and robust barrier layer becomes increasingly important to prevent the metal atoms from diffusing into adjacent dielectric layers. Moreover, it is desirable for a barrier layer to have a high wettability to the metal layer that will be deposited thereon to promote good adhesion between the barrier and metal layers, which prevents the metal layer from peeling and flaking. A non-conformal or non-uniform barrier layer may prevent the to-be-deposited metal layer from continuously and uniformly depositing on the barrier layer, thereby forming voids and defects in the interconnect structure and eventually leading to device failure.

Therefore, there is a need in the art for an improved barrier layer suitable for use in an interconnect structure.

SUMMARY OF THE INVENTION

Methods for depositing a robust and conformal barrier layer on a substrate are provided. In one embodiment, a method for depositing a barrier layer includes providing a substrate into a physical vapor deposition (PVD) chamber, supplying at least two reactive gases and an inert gas into the PVD processing chamber, sputtering a source material from a target disposed in the processing chamber in the presence of a plasma formed from the gas mixture, and forming a metal containing dielectric layer on the substrate from the source material.

In another embodiment, a method for depositing a barrier layer includes providing a substrate into a PVD chamber, supplying a reactive gas the PVD chamber, sputtering a source material from a target disposed in the PVD chamber in the presence of a plasma formed from the reactive gas, forming a metal containing dielectric layer on the substrate from the source material, and post treating the metal containing layer in presence of species generated from a remote plasma chamber.

In yet another embodiment, a method for forming an interconnect structure includes providing a substrate having a first conductive layer disposed thereon, forming a first metal barrier layer on the first conductive layer, wherein the first barrier layer is selected from a group consisting of tantalum containing layer and a titanium containing layer, forming a second metal barrier layer on the first metal barrier layer, wherein the second metal barrier layer is selected from a group consisting of a tantalum nitride containing layer and a titanium nitride containing layer, incorporating oxygen atoms into the second metal barrier layer, and forming a second conductive layer on the second metal barrier layer.

In yet another embodiment, a method for forming an interconnect structure includes providing a substrate having a dielectric layer disposed on a first conductive layer, the dielectric layer having a via formed therein to expose a portion of an upper surface of the first conductive layer, wherein the first conductive layer is a copper layer, depositing a first barrier layer within the via, the upper surface of the dielectric layer and the exposed surface of the first conducive layer, depositing a second barrier layer by a PVD process on the first barrier layer, wherein the second barrier layer is an oxygen containing layer, depositing a second conductive layer to fill the via formed within the dielectric layer, wherein the second conductive layer is an aluminum layer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention generally provide methods for depositing a layer for barrier applications in a metal interconnect fabrication process. The method provides a barrier layer having good barrier properties, such as high density, high wetting ability and less defects, while maintaining resistivity at a desired range, thereby improving the integrity and reliability of the devices formed.

Figure 1:
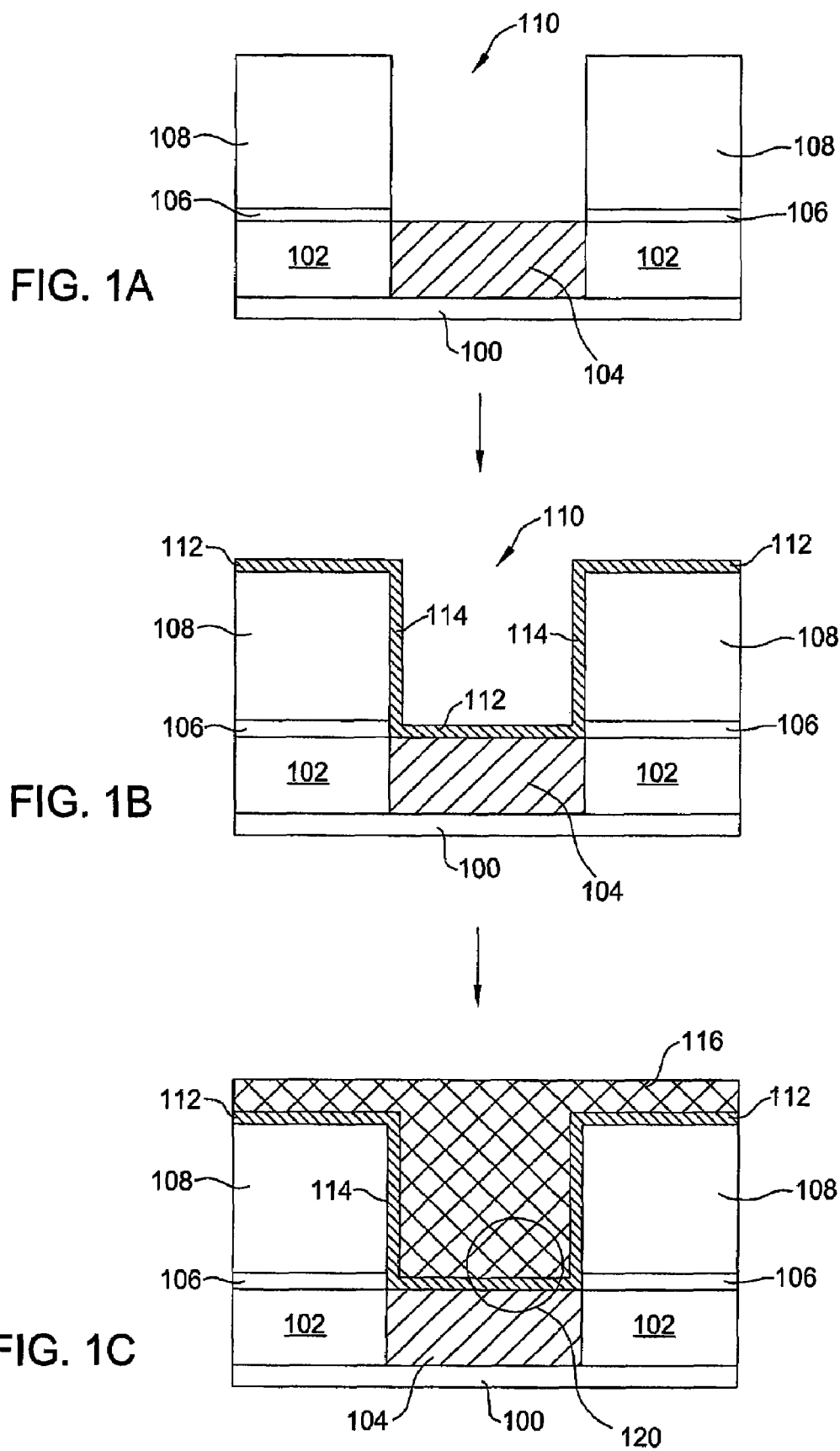
FIGS. 1A-C are sectional views of exemplary embodiment of a partial sequence for forming an interconnect structure.

FIG. 1 depicts an exemplary embodiment of a barrier layer formed on a substrate 100 suitable for fabricating an interconnect structure. A dielectric bulk insulating layer 108 and an underlying dielectric barrier layer 106 are stacked on another previously formed interconnect with a first conductive layer 104 embedded in another dielectric bulk insulating layer 102. The first conductive layer 104 may be fabricated from a metal material, such as copper, aluminum, tungsten, alloy thereof, and combinations thereof. As a via/trench etching process is completed and a via/trench 110 is defined in the dielectric bulk insulating layer 108, a metal barrier layer 112 may be deposited on the upper surface of the dielectric bulk insulating layer 108 and sidewall 114 of the via/trench 110 defined within the dielectric bulk insulating layer 108, as shown in FIG. 1B. After the barrier layer 112 is deposited on the substrate 100, a second conductive metal layer 116 may be deposited to fill in the via/trench 110, thereby forming metal interconnect structure on the substrate 100, as shown in FIG. 1C. The second conductive metal layer 116 may be fabricated from copper, aluminum, tungsten, alloys thereof, and combinations thereof. In one embodiment, the barrier layer 112 may be formed from a metal containing material in accordance with the embodiments described herein. Suitable examples of the metal containing material include tantalum nitride (TaN), tantalum oxynitride (TaON), tantalum (Ta), titanium (Ti), titanium nitride (TiN), titanium oxynitride (TiON), and combinations thereof. In one embodiment, the barrier layer 112 may be in form of a composite film that includes one or more layers. More details of the process and method for forming the barrier layer 112, as marked by the circle 120, will be described further below with reference to FIGS. 3-5.

In one embodiment, the dielectric bulk insulating layers 108, 102 are a dielectric material having a dielectric constant less than 4.0 (e.g., a low-k material). Examples of suitable low-k materials include carbon-containing silicon oxides (SiOC), such as BLACK DIAMOND® dielectric material available from Applied Materials, Inc., and other low-k polymers, such as polyamides. In the embodiment depicted in FIGS. 1A-C, the dielectric bulk insulating layer 108, 102 is a carbon-containing silicon oxide (SiOC) layer. The dielectric barrier layer 106 may have a dielectric constant of about 5.5 or less. In one embodiment, the dielectric barrier layer 106 is a carbon containing silicon layer (SiC), a nitrogen doped carbon containing silicon layer (SiCN), or the like. In the embodiment depicted in FIGS. 1A-1C, the dielectric barrier layer is a SiCN film. An example of the dielectric barrier layer material is BLOK® dielectric material, available from Applied Materials, Inc.

Figure 2:
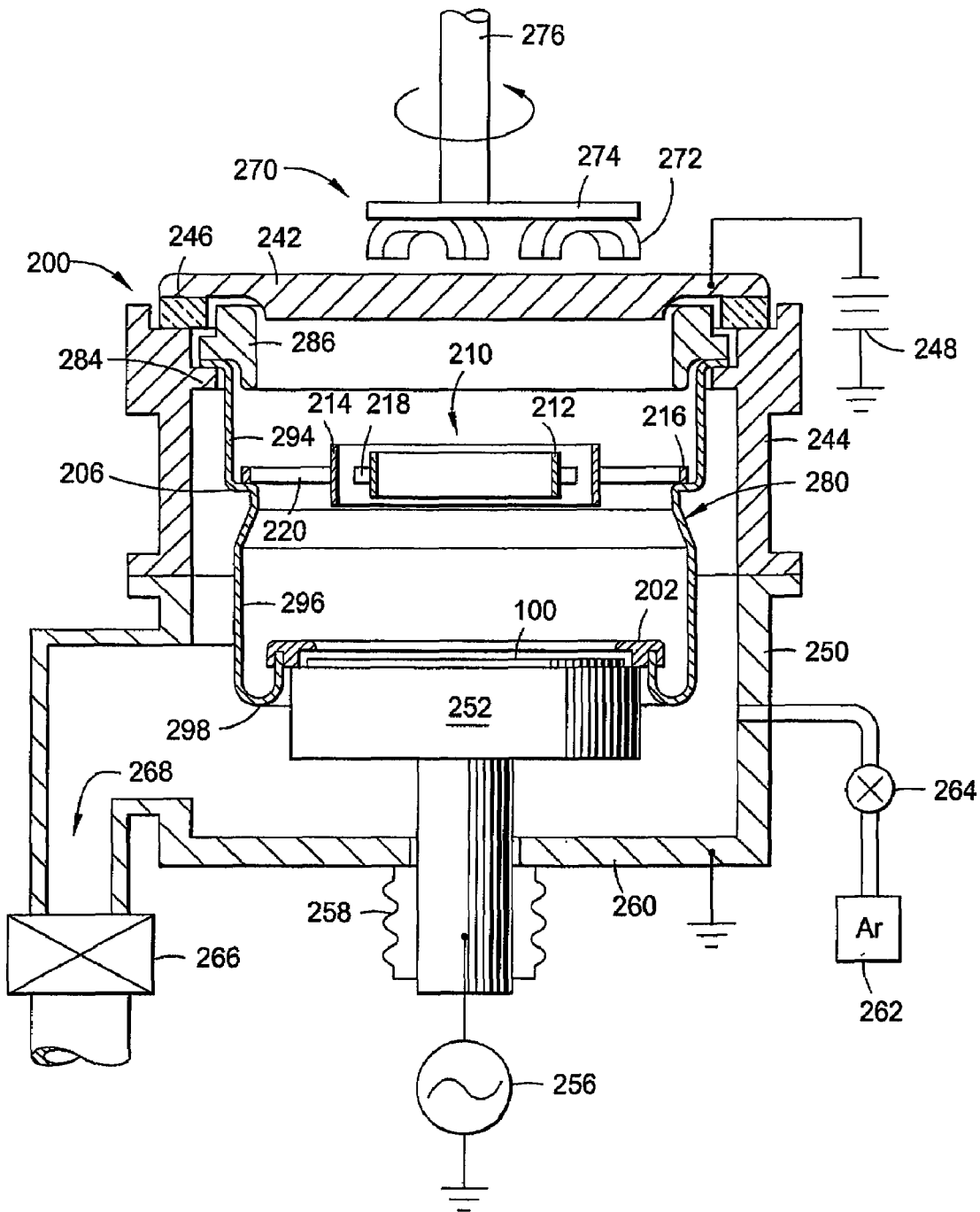
FIG. 2 is one embodiment of a physical vapor deposition chamber that may be used to deposit a barrier layer in accordance with one embodiment of the invention.

FIG. 2 illustrates one embodiment of physical vapor deposition chamber 200 in which the invention may be practiced. Example of suitable PVD chambers are ALPS® Plus and SIP ENCORE® PVD chambers, both commercially available from Applied Materials, Inc., Santa Clara, Calif. It is contemplated that processing chambers from other manufactures may also be utilized to practice the invention.

In one embodiment, the processing chamber 200 contains a sputtering source, such as a target 242, and a substrate support pedestal 252 for receiving the substrate 100 thereon. The substrate support pedestal 252 is located within a grounded enclosure wall 250, which may be a chamber wall as shown or a grounded shield.

The target 242 is supported on a grounded conductive aluminum adapter 244 through a dielectric isolator 246. The target 242 is comprised of a material to be deposited on the substrate 100 during sputtering, and may include at least one of titanium, tantalum, tungsten, aluminum, copper molybdenum, platinum, nickel, iron, niobium, palladium, alloys thereof, and combinations thereof. In one embodiment, the material of the target 242 may be selected from a group consisting of include titanium, tantalum, tungsten, aluminum, copper, alloys thereof, and combinations thereof.

The substrate support pedestal 252 supports the substrate 100 to be sputter coated in planar position opposite to the principal face of the target 242. The substrate support pedestal 252 has a material-receiving surface facing the principal surface of the target 242. The substrate support pedestal 252 is vertically movable through a bellows 258 connected to a bottom chamber wall 260 to facilitate transfer of the substrate 100 onto the substrate support pedestal 252 through a load lock valve (not shown) in the lower portion of processing the chamber 200 and thereafter raised to a deposition position. Processing gas is supplied from a gas source 262 through a mass flow controller 264 into the lower part of the chamber 200.

A controllable DC power source 248 coupled to the chamber 200 may be used to apply a negative voltage or bias to the target 242. An RF power supply 256 may be connected to the substrate support pedestal 252 in order to induce a negative DC self-bias on the substrate 100. In other applications, the substrate support pedestal 252 may be grounded or left electrically floating.

A rotatable magnetron 270 is positioned in back of the target 242. The magnetron 270 includes a plurality of magnets 272 supported by a base plate 274. The base plate 274 connects to a rotation shaft 276 coincident with the central axis of the chamber 200 and the substrate 100. The magnets 272 produce a magnetic field within the chamber 200, generally parallel and close to the surface of the target 242 to trap electrons and increase the local plasma density, which in turn increases the sputtering rate. The magnets 272 produce an electromagnetic field around the top of the chamber 200 and cause an electromagnetic field within the chamber to rotate which influences the plasma density of the process and promotes more uniform sputtering of the target 242.

The chamber 200 includes a grounded bottom shield 280 connected to a ledge 284 of the adapter 244. A dark space shield 286 is supported on the bottom shield 280 and is fastened to the shield 280 by screws or other suitable manner. The metallic threaded connection between the bottom shield 280 and the dark space shield 286 allows the two shields 280, 286 to be grounded to the adapter 244. The adapter 244 in turn is sealed and grounded to the aluminum chamber sidewall 250. Both shields 280, 186 are typically formed from hard, non-magnetic stainless steel.

The bottom shield 280 extends downwardly in an upper tubular portion 294 of a first diameter and a lower tubular portion 296 of a second diameter. The bottom shield 280 extends along the walls of the adapter 244 and the chamber wall 250 until reaching a top surface of the substrate support pedestal 252. A cover ring 202 rests on the top of the upwardly extending inner portion 200 of the bottom shield 280 when the substrate support pedestal 252 is in the lower position but rests on the outer periphery of the substrate support pedestal 252 when the pedestal is in a raised position to protect the substrate support pedestal 252 from sputtered material. An additional deposition ring (not shown) may be used to shield the periphery of the substrate 100 from deposition.

The chamber 200 may also be adapted to provide a more directional sputtering of material onto a substrate. In one embodiment, directional sputtering may be achieved by positioning a collimator 210 between the target 242 and the substrate support pedestal 252 to provide a more uniform and symmetrical flux of deposition material to the substrate 100.

The collimator 210 rests on the ledge portion of the bottom shield 280, thereby grounding the collimator 210. The ring collimator 210 may be a metal ring and includes an outer tubular section and at least one inner concentric tubular sections, for example, three concentric tubular sections 212, 214, 216 linked by cross struts (not shown). The outer tubular section 216 rests on the ledge portion 206 of the bottom shield 280. The use of the bottom shield 280 to support the collimator 210 simplifies the design and maintenance of the chamber 200. At least the two inner tubular sections 212, 214 are of sufficient height to define high aspect-ratio apertures that partially collimate the sputtered particles. Further, the upper surface of the collimator 210 acts as a ground plane in opposition to the biased target 242, particularly keeping plasma electrons away from the substrate 100.

Figure 5:
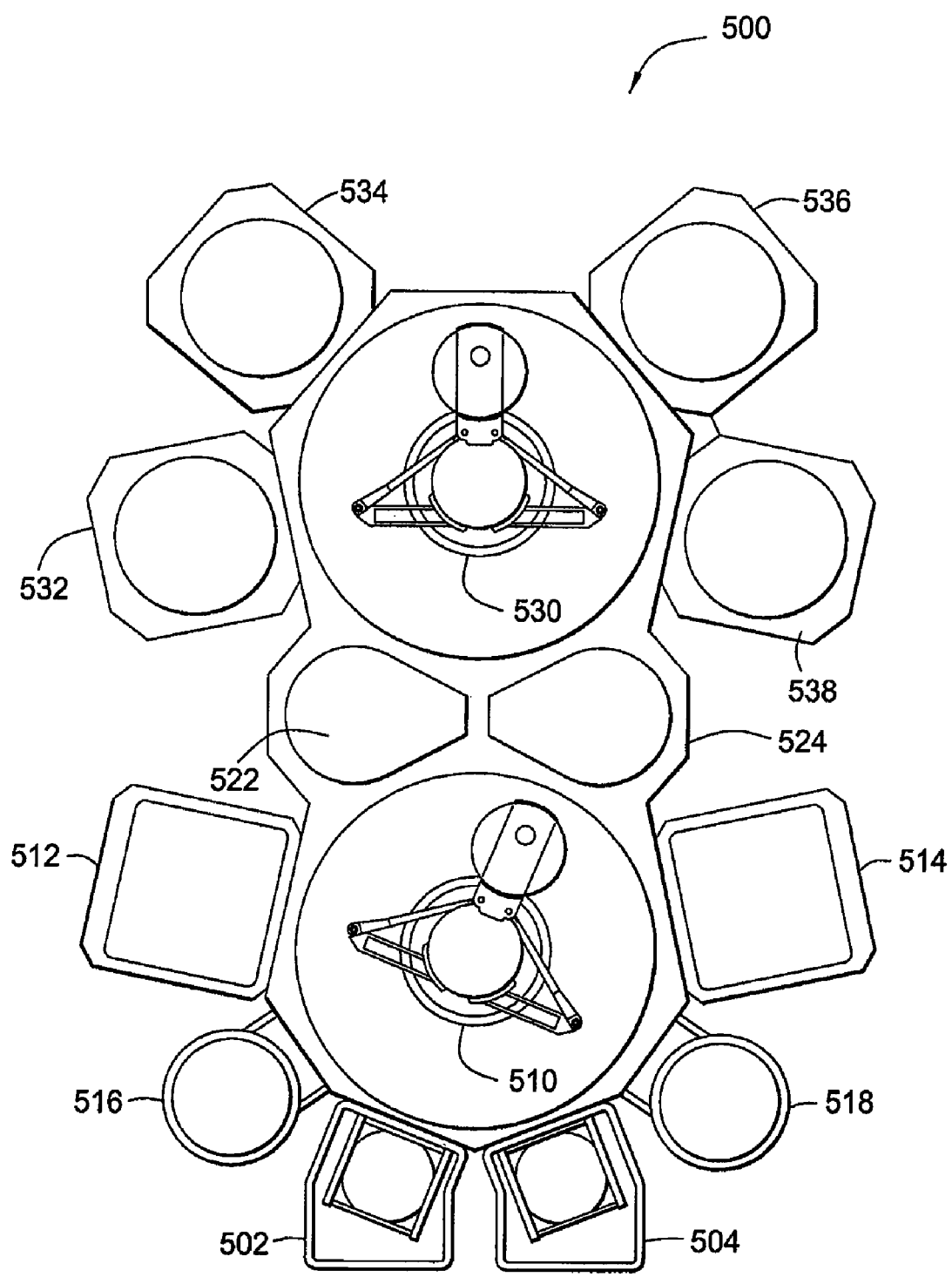
FIG. 5 is a schematic top view diagram of one example of a multi-chamber processing system which may be adapted to perform the process disclosed herein.

FIG. 5 is a schematic top-view diagram of an exemplary multi-chamber processing system 500 that includes at least one chamber 200 adapted to perform the processes disclosed herein. Examples of systems include ENDURA®, CENTURA®, and PRODUCER® processing systems, commercially available from Applied Materials, Inc. Another similar multi-chamber processing system that may be adapted to benefit from the invention is disclosed in U.S. Pat. No. 5,186,718, entitled "Stage Vacuum Wafer Processing System and Method," issued on Feb. 16, 1993, which is incorporated by reference herein.

The system 500 generally includes load lock chambers 502, 504 for the transfer of substrates 100 into and out from the system 500. Since the system 500 is operated under vacuum, the load lock chambers 502, 504 may be "pumped down" to facilitate entry and egress of substrates from the system. A first robot 510 may transfer the substrate 100 between the load lock chambers 502, 504, processing chambers 512, 514, transfer chambers 522, 524, and other chambers 516, 518. Furthermore, each processing chamber 512, 514, 516, and 518 may be configured to perform one of a number of substrate processing operations, such as cyclical layer deposition (including atomic layer deposition (ALD)), chemical vapor deposition (CVD), physical vapor deposition (PVD), etch, pre-clean, de-gas, orientation and other substrate processes. At least one of the chambers 512, 514, 516, 518, 532, 534, 536, 538 is configured as processing chamber 200 described above in FIG. 2.

The transfer chambers 522 and 524 are used to maintain ultrahigh vacuum conditions while allowing substrates to be transferred within the system 500. A second robot 530 may transfer the substrate 100 between the transfer chambers 522 and 524 and a second set of one or more processing chambers 532, 534, 536 and 538. Similar to processing chambers 512, 514, 516, and 518, the processing chambers 532, 534, 536, and 538 can be configured to perform one of a variety of substrate processing operations, such as cyclical layer deposition (including atomic layer deposition (ALD)), chemical vapor deposition (CVD), physical vapor deposition (PVD), etch, pre-clean, de-gas, and orientation. Any of the substrate processing chambers 512, 514, 516, 518, 532, 534, 536, and 538 may be removed from the system 500 if not necessary for a particular process to be performed by the system 500.

In one embodiment, the processing system 500 includes one or more pre-clean chambers to preclean the substrate and one or more PVD chambers configured to deposit barrier layers, seed layers or conductive metal layers. To enhance efficiency and throughput of the system, one configuration of the processing system includes two precleaning chambers, such as precleaning chambers 512, 514 configured to preclean the substrate surface, four ALD or PVD chambers, such as processing chambers 534, 536, 532, 538, configured to deposit barrier layers or to deposit seed layers disposed in connection with the back-end central transfer chamber. In one embodiment, the chambers 512, 514 are configured as precleaning chambers while the processing chambers 532, 534, 538, 538 are configured to deposit at least one of metal tantalum (Ta), metal titanium (Ti), metal aluminum (Al), aluminum alloy, tantalum nitride (TaN), titanium nitride (TiN), tantalum oxynitride (TaON), titanium oxynitride (TiON) by a PVD process.

In an exemplary embodiment, the substrate 100 is transferred into at least one of the precleaning chambers 512, 514 to preclean the surface of the substrate 100, for example, to remove native oxides or other surface contaminants. Following the precleaning step, the substrate 100 is transferred into at least one of processing chambers 534, 536 to deposit the barrier layer 114, such as Ti, Ti/TiN/Ti, Ti/TiON/Ti, Ta, Ta/TaN/Ta, Ta/TaON/Ta, or the like on the substrate 100. The substrate is then transferred to at least one of processing chambers 532, 538 to fill the via/trench 110 on the substrate 100 with Al, Cu, W, or other conductive material.

In yet another exemplary embodiment, the substrate 100 is transferred into one of the precleaning chambers 512, 514 to preclean the surface of the substrate 100. Following the precleaning step, the substrate 100 is transferred into at least one of the processing chambers 534, 536 to deposit the barrier layer 114, such as Ti, Ti/TiN/Ti, Ti/TiON/Ti, Ta, Ta/TaN/Ta, Ta/TaON/Ta, or the like on the substrate 100. After the barrier layer 114 is deposited, the substrate 100 may be transferred back to the precleaning chambers 512, 514, to perform an optional post treatment process. Alternatively, the post treatment process may be performed in any other treatment/annealing process chamber incorporated in the system 500, or any other suitable systems and chambers capable of performing the treatment process. Subsequently, the substrate 100 may be further transferred to another processing chamber 532, 538 to further fill the via/trench 110 on the substrate 100 with Al, Cu, W, or other conductive material. Alternatively, the via/trench 110 may be filled in another chamber, such as a chamber or module configured for an electroplating (ECP) process, disposed in a system other than the system 500.

Figure 3:
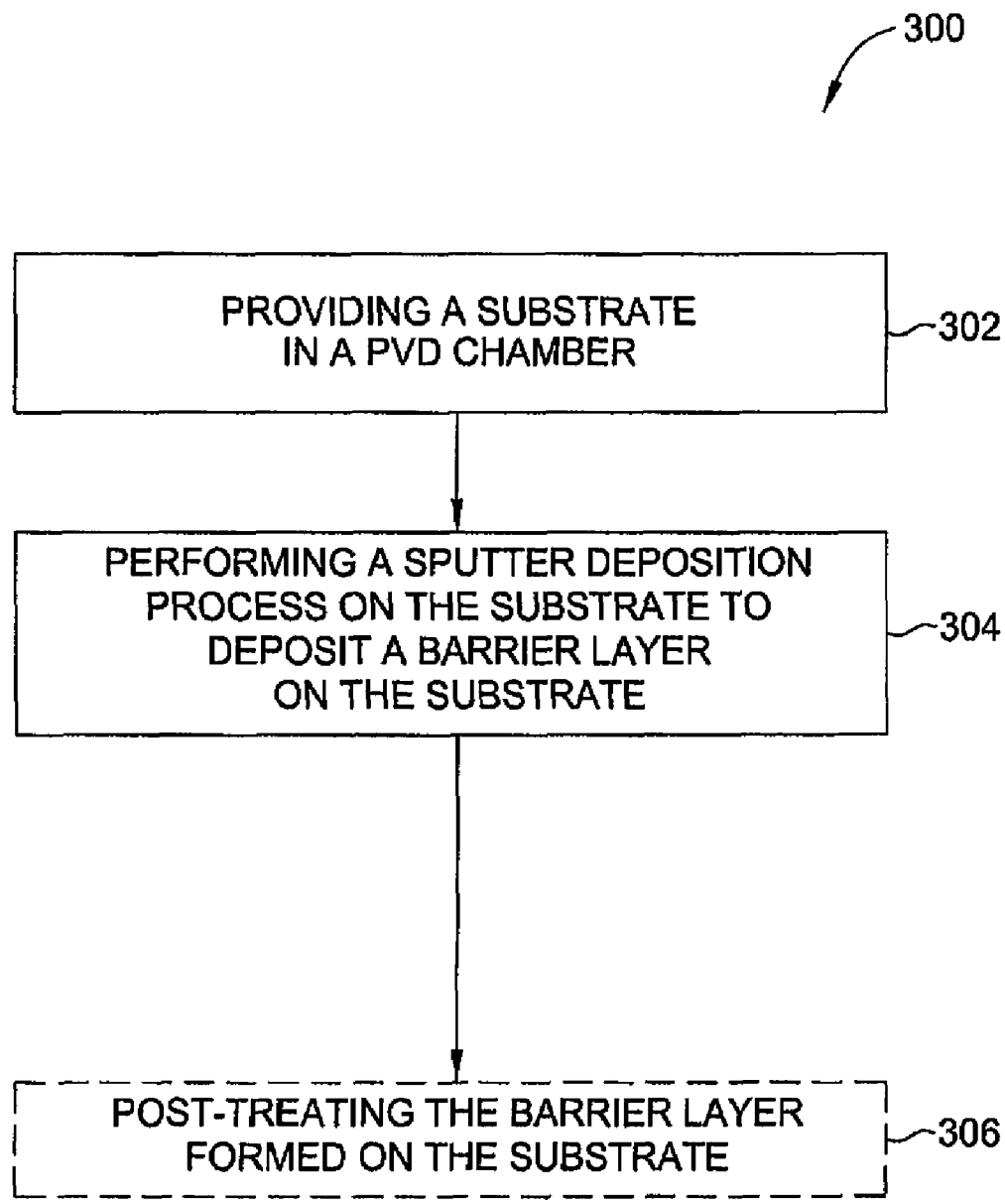
FIG. 3 is a flow diagram of another embodiment of a barrier layer formation process in metallization process.
Figure 4A:
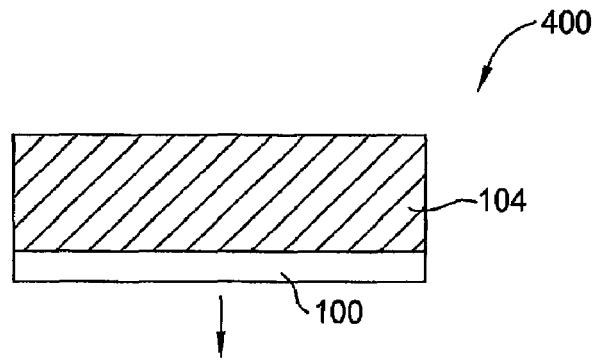
FIGS. 4A-4E are sectional views of one embodiment of an interconnect structure performed in accordance to the processes described in FIG. 3.

FIG. 3 illustrates a flow diagram of one embodiment of a barrier layer formation process 300 according to one embodiment of the invention. FIGS. 4A-AE are schematic cross-sectional views illustrating the sequence of the barrier layer formation process 300. The process 300 may be utilized to deposit other barrier layer films that require more than one element, such as a compound film.

Figure 4B:
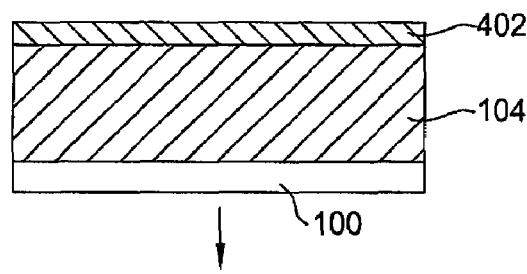

At block 302, a substrate having a first conductive layer 104 formed on the substrate 100 is provided, as shown in FIG. 4A. A pre-formed barrier layer 402 may optionally be previously formed on the substrate 100 ready for processing, as shown in FIG. 4B. In an embodiment wherein the pre-formed barrier layer 402 is not present, the process 300 may be performed directly on the first conductive layer 104. The process for forming the pre-formed barrier layer 402 may be any conventional process suitable to deposit the pre-formed barrier layer 402.

In one embodiment, the pre-formed barrier layer 402 may be a metal containing layer. Suitable examples of the metal containing layer include tantalum (Ta), titanium (Ti), tantalum nitride (TaN), tantalum oxynitride (TaON), titanium nitride (TiN), titanium oxynitride (TiON), alloys thereof or combinations thereof. In an exemplary embodiment depicted in FIG. 4B, the pre-formed barrier layer 402 is a titanium (Ti) layer or a tantalum (Ta) layer.

Figure 4C:
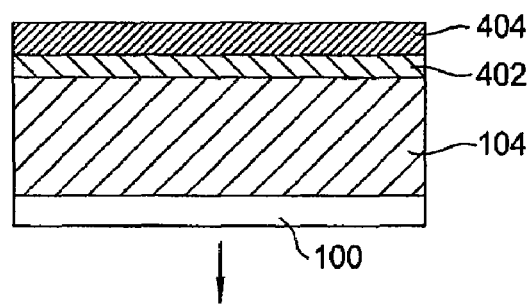

At block 304, the substrate 100 is transferred to a deposition chamber, such as the deposition chamber 200 shown in FIG. 2 or one of the other deposition chambers of the system 500 shown in FIG. 5, to perform a sputter deposition process on the substrate. The sputter deposition deposits a barrier layer 404 on the substrate 100, as shown in FIG. 4C.

During sputtering deposition process, a deposition gas mixture may be supplied into the process chamber 200 to react with the source material sputtered from the target 242. As described above, the ions in the plasma bombard and sputter off material from the target 242, forming the barrier layer 404 on the substrate 100. In one embodiment, the deposition gas mixture may include a reactive gas, non-reactive gas, inert gas, and the like. Examples of reactive and non-reactive gas include, but not limited to, $O_2$, $N_2$, $N_2O$, $NO_2$, and $NH_3$, $H_2O$, among others. Examples of inert gas include, but not limited to, Ar, He, Xe, and Kr, among others.

In a particular embodiment wherein the barrier layer 404 is desired to be a metal nitride layer, a nitrogen containing gas is provided in the gas mixture to serve as a reactive gas. The nitrogen containing gas reacts with the sputtered material from the target 242, thereby forming the metal nitride as the barrier layer 404 on the substrate 100. In the embodiment wherein the barrier layer 404 is desired to be formed as a metal oxynitride layer, at least a nitrogen containing gas and at least an oxygen containing gas is supplied into the processing chamber 200 to serve as the reactive gas. The nitrogen and oxygen containing gas react with the sputtered material from the target 242, forming metal oxynitride as the barrier layer 404 on the substrate. Suitable examples of the nitrogen containing gas include $N_2$, $N_2O$, $NO_2$, $NH_3$ and the like. Suitable examples of the oxygen containing gas include $O_2$, $O_3$, $H_2O$, $N_2O$, $NO_2$ and the like. The nitrogen and the oxygen containing reactive gases may be either in-situ ionized by a plasma generated within the processing chamber 200, or ex-situ ionized from a remote plasma source generated away from the interior of the processing chamber 200 and further delivered into the processing chamber 200. The active oxygen species, generated either in-situ in the processing chamber or ex-situ from the processing chamber, reacts with the nitrogen species and the sputtered material from the target 242, thereby incorporating oxygen element while forming the barrier layer 404 on the substrate 100. In one embodiment, the flow rate of the oxygen containing gas supplied into the processing chamber to form the metal oxynitride film is less than the flow rate of nitrogen containing gas supplied to the processing chamber. In an exemplary embodiment wherein the oxygen containing gas is $O_2$ gas and the nitrogen containing gas is $N_2$, the flow rate ratio of the $O_2$ gas and the nitrogen containing gas is $N_2$ is between about 1:2 to about 1:10, such as between about 1:2 to about 1:5.

Furthermore, inert gas, such as Ar, He, and Xe, may be supplied in the gas mixture to bombard the plasma and accelerate ions toward the target and assist the material source sputtered from the target 242.

In an embodiment wherein the barrier layer 404 is desired to be a nitrogen containing barrier layer, such as a TaN or TiN layer, the target 242 disposed in the processing chamber 200 comprises metal Ta or metal Ti and the gas mixture supplied into the chamber 200 may include Ar and $N_2$ gas. In the embodiment wherein the barrier layer 404 is desired to be a TaON or TiON layer, the target disposed in the processing chamber 200 is a metal Ta or metal Ti target and the gas mixture supplied into the chamber 200 may include Ar, $N_2$ and $O_2$ gas.

In one embodiment, the deposition gas mixture supplied into the processing chamber 200 includes Ar gas at a flow rate between about 0 sccm and about 500 sccm, such as between about 0 sccm and about 300 sccm, for example between about 0 sccm and about 100 sccm, such as less than 10 sccm. The nitrogen containing gas is supplied at a flow rate between about 0 sccm and about 500 sccm, such as between about 0 sccm and about 300 sccm, for example between about 0 sccm and about 100 sccm, such as about 70 sccm. The oxygen containing gas is supplied at a flow rate between 0 sccm and about 500 sccm, such as between about 0 sccm and about 200 sccm, for example between about 0 sccm and about 100 sccm, such as between about 0 sccm and about 10 sccm. RF power is applied to the target 242 and/or the substrate support pedestal 252. In one embodiment, the RF power supplied to the target is a DC power. In one embodiment, the RF power may be supplied to the target 242 between about 10,000 Watts and about 38,000 Watts and the RF power may be supplied to the substrate support pedestal 252 between about 0 Watts and about 1000 Watts.

Several process parameters may be regulated at block 306. In one embodiment, a pressure of the deposition gas mixture in the process chamber 200 is regulated between about 0 mTorr and about 100 mTorr. The substrate temperature may be maintained between about 0 degrees Celsius and about 500 degrees Celsius, such as between about 200 degrees Celsius and about 500 degrees Celsius. The processing time may be set for a predetermined processing period or terminated after a desired thickness of the first barrier layer 404 has been deposited on the substrate 100. In one embodiment, the process time may be processed at between about 0 seconds and about 600 seconds, such as between about 10 seconds to about 100 seconds.

By in-situ using one or more reactive gases to incorporate different elements into the barrier layer 404 while forming the barrier layer 404 in a single step, the overall manufacture cost and throughput may be improved.

It is noted that the barrier layer application can also be used for straining engineering. The straining engineering is particularly suitable in applying in gate structure fabrication. The film stress of the barrier layer 404 may strain atoms within the adjacent films, changing the lattice structure and atom arrangement within the adjacent films, thereby adjusting mobility of electrons and holes of the film to modify the electrical performance of a device. The film stress of the barrier layer 404 may be adjusted by changing the gas flow rate and the RF power applied to the processing chamber 200.

In an embodiment wherein a compressive film stress is desired for the barrier layer 404, a RF power ranging between about 0 Watts and about 600 Watts may be supplied into the chamber 200 to formed the desired compressive film. In one embodiment, the film stress of the barrier layer may be configured between about $1 \times E^7$ pascal (Pa) and about $1 \times E^9$ pascal (Pa). In the embodiment wherein the barrier layer 404 is disposed on a silicon film for a gate fabrication process, the film stress of the barrier layer 404 strains the silicon atoms within the adjacent silicon film, serving as a straining capping layer, twisting the lattice structure within the silicon film. The twisted lattice structure displaces and/or stretches atoms within the underlying silicon film, thereby improving mobility of electrons and holes within the silicon film and increasing drive current performance. It is noted that when the process is applied in strain engineering, the barrier layer may be removed from the substrate after the straining process has been completed.

At block 306, after the barrier layer 404 is formed on the substrate, an post treatment process may be optionally performed to treat and/or anneal the surface of the barrier layer 404. As the barrier layer 404 may need different film properties to meet different process requirements, the post treatment process performed at block 306 may be performed to not only treat the substrate surface to repair dangling bonds on the upper surface of the barrier layer 404, but also incorporate a desired amount of elements into the barrier layer 404 during the treatment process. In one embodiment, the treatment gas supplied to treat the barrier layer 404 may be an oxygen containing gas. Suitable examples of the oxygen containing gas include $O_2$, $N_2O$, $NO_2$, $NO$, $O_3$, $H_2O$ and the like. The atomic oxygen are treated into the upper surface of the barrier layer 404, incorporating oxygen atoms into the barrier layer 404 to a desired depth, thereby converting the barrier layer 404 into oxygen containing barrier layer film. In an embodiment wherein the barrier layer 404 is already configured as an oxygen containing barrier layer, e.g., formed as an oxygen containing barrier layer 404 at the time the layer is formed at block 306, the optional post treatment process may be eliminated.

In one embodiment, the treatment process may be performed in a precleaning chamber, such as the precleaning chamber 516, 518 depicted in FIG. 5, which may have a remote plasma source. The precleaning chamber 516, 518 may be incorporated into the system 500 adjacent to the deposition chamber 200 so that the barrier layer 404 may be treated after the barrier layer deposition is completed. In another embodiment, the treatment process may be performed in annealing/treatment chamber having a remote plasma source. In yet another embodiment, the treatment process may be performed in other types of chamber having a remote plasma source. The treatment process is performed by ex-situ providing a plasma containing ionized oxygen species and delivering the ionized oxygen species into the annealing/treatment chamber to treat the barrier layer 404. The oxygen species provided from the remote source assists repairing the voids, pinpoints, defects, and/or lattice structure within the barrier layer 404, thereby densifying the film structure of the barrier layer 404. Additionally, the post treatment process also assists oxygen ion species dissociated from the remote plasma source to remain in atomic oxygen state rather than recombining as molecular oxygen. It is believed that the atomic oxygen is highly active and can easily be incorporated into the film grain boundary within the barrier layer film, thereby forming a strong bonding within the film, and producing a robust and stable barrier layer on the substrate.

In one embodiment, other process gases, such as $H_2$, $H_2O$ and the like, and inert or carrier gas, such as Ar, He, $N_2$ and the like, may be supplied as part of the gas mixture to assist treating the barrier layer and to prevent the oxygen ions from colliding and recombining back to molecular state.

During the post treatment process, several process parameters may be regulated. In one embodiment, a pressure of post treatment process in the annealing/treatment process chamber is regulated between about 0 mTorr and about 1000 mTorr, such as between about 500 mTorr and about 1000 mTorr. The substrate temperature may be maintained between about 20 degrees Celsius and about 400 degrees Celsius, such as between about 200 degrees Celsius and about 300 degrees Celsius. The processing time may be set to a predetermined processing period or terminated after a desired amount of oxygen atoms has been treated into the barrier layer 604. In one embodiment, the process time may be processed at between about 0 seconds and about 120 seconds, for example between about 10 seconds and about 80 seconds, such as between about 30 seconds to about 40 seconds.

In the embodiment depicted in FIG. 4C, wherein the barrier layer 404 is a TiN or TaN layer formed by the process described at block 304, the optional post treatment process is performed to incorporate oxygen atoms into the barrier layer 404, thereby forming a metal oxynitride, such as a TiON or TaON layer. In the embodiment wherein the barrier layer 404 is already formed as a TiON or TaON layer by in-situ incorporating oxygen atoms into the barrier layer 404 while forming the layer 404, the optional post treatment process may be eliminated.

Figure 4D:
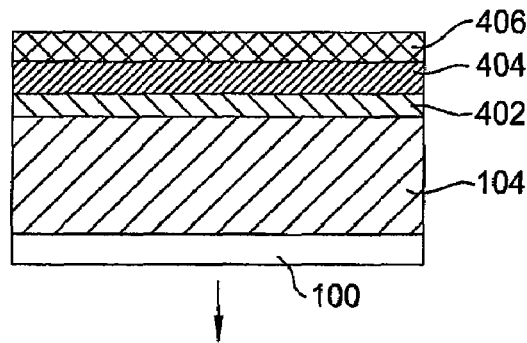

An upper barrier layer 406 may be formed on the barrier layer 404, as shown in FIG. 4D. The upper barrier layer 406 may be selected to have a good adhesion and/or wetting ability to both the underlying barrier layer 404 and to the material to be deposited on the upper barrier layer 406, such as a second metal layer 408, which will be described further below with referenced to FIG. 4E. The high adhesion or wetting ability for the upper barrier layer 406 to the second metal conductive layer 408 prevents the film structure from peeling off or crack during future processing. In the embodiment wherein the barrier layer 404 is selected from a material having good adhesion and/or wetting ability to both the underlying barrier layer 402 and the upper to-be-deposit second metal conductive layer 408, the upper barrier layer 406 may be eliminated. In one embodiment, the upper barrier layer 406 may be a metal titanium (Ti) film, a metal tantalum (Ta) film, a nitrogen containing metal and/or a oxygen containing metal layer, such as tantalum nitride (TaN), tantalum oxynitride (TaON), titanium nitride (TiN), titanium oxynitride (TiON), alloys thereof, or combinations thereof. In the particular embodiment depicted in FIG. 4D, the upper barrier layer 406 is a metal titanium (Ti) layer or a metal tantalum (Ta) layer.

Figure 4E:
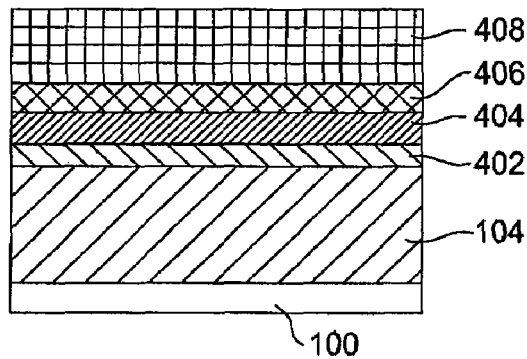

After the upper barrier layer 406 has been formed on the substrate to define a triple layer structure for barrier applications, the second metal conductive layer 408 may be deposited on the substrate 100, as shown in FIG. 4E. The second metal conductive layer 408 may be formed may any suitable techniques. In one embodiment, the second conductive metal layer 408 deposited on the substrate 100 may be a metal material selected from copper (Cu), aluminum (Al), tungsten (W), alloys thereof, or combinations thereof. The second conductive metal layer 408 may be deposited by any suitable manner, such as electroplating, CVD, PVD, ALD, or the like.

EXAMPLES

In an exemplary embodiment depicted herein, the first conductive layer 104 is a copper layer (Cu). Subsequently, the lower barrier layer 402 is deposited on the first conductive layer 104. The lower barrier layer 402 may be deposited by a PVD deposition process to sputter deposit a titanium layer (Ti) and/or a tantalum (Ta) layer as the first barrier layer 402. Afterwards, the barrier layer 404, such as a titanium oxynitride layer (TiON) and/or a tantalum oxynitride (TaON) layer, is deposited on the lower barrier layer 402. The barrier layer 404 may be deposited by the process 300 by supplying a gas mixture including at least a nitrogen and at least an oxygen containing gas into the sputter chamber to react with the source material sputtered from the target disposed within the sputter chamber. After the barrier layer 404 has been formed, the upper barrier layer 406 is formed on the substrate. The upper barrier layer 406 may be a titanium layer (Ti) and/or a tantalum (Ta) layer. After the upper barrier layer 406 has been disposed on the substrate 100, the second conductive layer 408, such as an aluminum layer (Al), is depositing on the substrate 100. The triple layer barrier structure provides a stable, dense composite barrier layer having good barrier properties that prevent the underlying first conductive layer 104 from diffusing to the upper second conductive layer 408 and/or adjacent dielectric layer while maintaining the via and/trench resistivity at a desired range. Accordingly, a copper (Cu) and aluminum (Al) hybrid interconnect structure with improved and robust barrier application is thus formed on the substrate. The copper (Cu) and aluminum (Al) hybrid interconnection structure described above may be advantageously used in flash memory backend interconnection (BEOL) process.

By in-situ incorporating the oxygen atoms into the barrier layer 404 during the barrier layer formation process, the overall manufacture cost and throughput may be improved. It is noted that the barrier layer, such as the titanium oxynitride layer (TiON) and/or the tantalum oxynitride (TaON) layer, can also be used in straining engineering. The titanium oxynitride layer (TiON) and/or the tantalum oxynitride (TaON) layer provide a residual film stress at a desired range. The residual film stress provides strain to a film layer, such as a silicon film, where the barrier layer is disposed on. The barrier layer serves as a straining capping layer. The residual film stress in the barrier layer induces strain to the underlying silicon film, thereby twisting the lattice structure within the silicon film. The twisted lattice structure displaces and/or stretches atoms within the underlying silicon film, thereby improving mobility of electrons and holes within the silicon film and increasing drive current performance.

Examples

In another exemplary embodiment, the first conductive layer 104 is a copper layer (Cu). The lower barrier layer 402 is deposited on the first conductive layer 104. The lower barrier layer 402 may be deposited by a PVD deposition process to sputter deposit a titanium layer (Ti) and/or a tantalum (Ta) layer as the first barrier layer 402. The barrier layer 404, such as a titanium nitride layer (TiN) and/or a tantalum nitride (TaN) layer, is deposited on the lower barrier layer 402. The barrier layer 404 may be deposited by the process 300 described in FIG. 3 by supplying a gas mixture including a nitrogen containing gas into the sputter chamber to react with the source material sputtered from the target disposed within the sputter chamber. A post treatment process is performed to treat the upper surface of the barrier layer 404, incorporating oxygen atoms into the barrier layer 404, thereby densifying the barrier layer 404, and converting the barrier layer 404 into a metal oxynitride layer, such as a titanium oxynitride layer (TiON) and/or a tantalum oxynitride (TaON) layer. The post treatment process may be performed at a precleaning chamber or other suitable plasma chamber having a remote plasma source. The post treatment process may be performed as described at block 306. After the post treatment process performed on the barrier layer 404, an upper barrier layer 406 is formed on the barrier layer 404. The upper barrier layer 406 may be a titanium layer (Ti) and/or a tantalum (Ta) layer. After the upper barrier layer 406 has been disposed on the substrate 100, the second conductive layer 408, such as an aluminum layer (Al), is depositing on the substrate 100. The triple layer barrier structure provide a stable and dense composite barrier layer having good barrier properties that prevent the underlying first conductive layer 104 from diffusing to the upper second conductive layer 408, while maintaining the via and/trench resistivity within a desired range. Accordingly, a copper (Cu) and aluminum (Al) hybrid interconnect structure with improved and robust barrier application is thus formed on the substrate. The copper (Cu) and aluminum (Al) hybrid interconnection structure described above may be advantageously used in flash memory backend interconnection (BEOL) process.

Thus, methods of forming a barrier layer for an interconnection structure are provided. The improved barrier layer advantageously provides a high density and good barrier film properties while maintaining resistance of the barrier layer at a desired range. Additionally, the methods also reduce overall manufacture cost and increase throughput, thereby efficiently improving the product cycle time and production efficiency.

While the foregoing is directed to embodiments of the present invention, other and further embodiments of the invention may be devised without departing from the basic scope thereof, and the scope thereof is determined by the claims that follow.

What is claimed is:

1. A method of forming a barrier layer on a substrate, comprising:
   providing a substrate into a physical vapor deposition (PVD) chamber;
   supplying a gas mixture comprising at least an oxygen containing gas, a nitrogen containing gas and an inert gas into the PVD chamber, wherein a flow rate of the oxygen containing gas supplied into the PVD chamber is less than a flow rate of the nitrogen containing gas supplied to the PVD chamber;
   sputtering a source material from a target disposed in the PVD chamber in the presence of a plasma formed from the gas mixture; and
   forming a metal containing dielectric layer on the substrate from the source material.

2. The method of claim 1, wherein the oxygen containing gas is at least one of $O_2$, $N_2O$, $NO_2$ and $H_2O$ and the nitrogen containing gas is at least one of $N_2$, $N_2O$, $NO_2$, and $NH_3$.

3. The method of claim 1, wherein the oxygen containing gas is $O_2$ and the nitrogen containing gas is $N_2$.

4. The method of claim 1, wherein the source material of the target is selected from a group consisting of titanium, tantalum, tungsten, aluminum, copper, alloys thereof, and combinations thereof.

5. The method of claim 1, wherein the metal containing dielectric layer formed on the substrate is a TaON or a TiON layer.

6. The method of claim 1, wherein the inert gas is selected from a group consisting of Ar and He.

7. The method of claim 1, further comprising:
thermally treating the metal containing dielectric layer.

8. A method of forming a barrier layer on a substrate, comprising:
providing a substrate into a physical vapor deposition (PVD) chamber;
supplying a gas mixture comprising at least an oxygen containing gas, a nitrogen containing gas and an inert gas into the PVD chamber, wherein a flow rate of the oxygen containing gas supplied into the PVD chamber is less than a flow rate of the nitrogen containing gas supplied to the PVD chamber;
sputtering a source material from a target disposed in the PVD chamber in the presence of a plasma formed from the gas mixture;
forming a metal containing dielectric layer on the substrate from the source material; and
post treating the metal containing layer in presence of species generated from a remote plasma chamber.

9. The method of claim 8, wherein post treating the metal containing layer further comprises:
incorporating oxygen atoms into the metal containing dielectric layer.

10. The method of claim 8, wherein the remote plasma chamber is incorporated in a precleaning chamber.

11. The method of claim 8, wherein post treating the metal containing layer further comprises:
converting the metal containing dielectric layer into an oxygen and metal containing dielectric layer.

12. The method of claim 8, wherein the nitrogen containing gas selected from a group consisting of $N_2$, $N_2O$, $NO_2$, and $NH_3$.

* * * * *

UNITED STATES PATENT AND TRADEMARK OFFICE
CERTIFICATE OF CORRECTION

PATENT NO. : 7,618,893 B2  Page 1 of 1
APPLICATION NO. : 12/041804
DATED : November 17, 2009
INVENTOR(S) : Fu et al.

It is certified that error appears in the above-identified patent and that said Letters Patent is hereby corrected as shown below:

Title Page
In the Abstract (57):

Line 3, please delete "valor" and insert --vapor-- therefor;

In the Detailed Description:

Column 6, Line 67, please delete "4A-AE" and insert --4A-4E-- therefor.

Signed and Sealed this

Fifth Day of January, 2010

David J. Kappos
*Director of the United States Patent and Trademark Office*